US007741880B2

(12) United States Patent
Cha et al.

(10) Patent No.: US 7,741,880 B2
(45) Date of Patent: Jun. 22, 2010

(54) DATA RECEIVER AND DATA RECEIVING METHOD

(75) Inventors: Young-su Cha, Busan (KR); Kyoung-Hoon Yang, Daejeon (KR)

(73) Assignees: Samsung Electronics Co., Ltd., Suwon-Si (KR); Korea Advanced Institute of Science and Technology, Yuseong-Gu, Daejeon (KR)

(*) Notice: Subject to any disclaimer, the term of this patent is extended or adjusted under 35 U.S.C. 154(b) by 683 days.

(21) Appl. No.: 11/677,779

(22) Filed: Feb. 22, 2007

(65) Prior Publication Data
US 2008/0174343 A1 Jul. 24, 2008

(30) Foreign Application Priority Data
Jan. 18, 2007 (KR) ...................... 10-2007-0005725

(51) Int. Cl.
*H03K 5/22* (2006.01)
(52) U.S. Cl. .......................................... 327/65; 327/63
(58) Field of Classification Search .................. 327/50, 327/58, 63, 65, 52; 375/316
See application file for complete search history.

(56) References Cited

U.S. PATENT DOCUMENTS

| 5,726,592 | A | * | 3/1998 | Schulte et al. | ................. 327/65 |
| 5,864,587 | A | * | 1/1999 | Hunt | .......................... 375/316 |
| 6,288,576 | B1 | | 9/2001 | Casier | |
| 6,605,997 | B1 | * | 8/2003 | Hanson et al. | .............. 330/253 |
| 7,532,046 | B2 | * | 5/2009 | Wolthek et al. | ............. 327/108 |
| 2005/0218986 | A1 | | 10/2005 | Garlepp et al. | |

FOREIGN PATENT DOCUMENTS

| KR | 10200030006950 A | 1/2003 |
| KR | 1020030010234 A | 2/2003 |

* cited by examiner

*Primary Examiner*—Hai L Nguyen
(74) *Attorney, Agent, or Firm*—F. Chau & Associates, LLC

(57) ABSTRACT

A data receiver and a data receiving method in which the data receiver generates two comparison signals based on amplitude modulated differential input signals, amplifies the comparison signals, compares amplified signals, and outputs logic operation results based on the amplitude modulated differential input signals and the comparison signals, thereby detecting data bits. Accordingly, the number of necessary amplifiers and comparators is reduced and a separate reference voltage generator is not needed, so that chip size reduction and low-power operation is accomplished.

15 Claims, 9 Drawing Sheets

Vin+ < Vin−

Vin+ > Vin−

DATA RECEIVER AND DATA RECEIVING METHOD

CROSS-REFERENCE TO RELATED PATENT APPLICATION

This application claims priority under 35 U.S.C. § 119 from Korean Patent Application No. 2007-0005725, filed on Jan. 18, 2007, the disclosure of which is hereby incorporated by reference herein as if set forth in its entirety.

TECHNICAL FIELD

The present disclosure relates to a data receiver and, more particularly, to a data receiver for generating data bits in response to amplitude modulated differential input signals, and a data receiving method.

BACKGROUND

Generally, low voltage differential signaling (LVDS) is used for high-speed data transport between a transmitter (for example, a timing controller) and a receiver (for example, a panel) in a display apparatus. The LVDS reduces power consumption when the transmitter transmits data and enables high-speed transmission and, therefore, is advantageous in terms of low power, high-speed operation, noise, and cost. For this reason, the LVDS is used as a standard in data communication.

For instance, when a first power supply voltage is 2.5 V in the interface between a transmitter and a receiver in the LVDS system, the transmitter can transmit data of "1" with 1.4 V and data of "0" with 1.0 V. In other words, the amount of change between the data "1" and the data "0" is only 0.4 V. Accordingly, the LVDS system responds to signal changes more quickly than another method (for example, single-ended signaling) in which the amount of change is determined by a single reference voltage (for example, a ground voltage) and thereby is advantageous in high-speed operation. In addition, since signals are differentially transmitted in the LVDS system, common mode noise is suppressed and, thus, adverse influence of noise is alleviated.

In a display apparatus using LVDS, a data, transmission rate is limited by the switching speed of the transmitter and the receiver and the bandwidth of the transmission line. More specifically, an interface for large flat screen displays uses a long transmission, line and has a low bandwidth. In order to increase a transmission rate of the transmission line having the low bandwidth, amplitude modulation has recently been used.

FIG. 1 is a waveform diagram for explaining amplitude modulation in conventional LVDS. Referring to FIG. 1, conventional LVDS transmits two bits at a time using amplitude modulation (for example, pulse amplitude modulation (PAM)), thereby doubling a transmission rate. In other words, in the conventional data receiving method, two bits are simultaneously transmitted using four symbols (that is, 00, 01, 11, and 10) according to a symbol state of the amplitude modulated signals while the frequency of a transmission signal is maintained constant in a transmission line having a limited bandwidth and, therefore, a higher transmission rate is accomplished.

FIG. 2 is a functional block diagram of a conventional data receiver 10, FIG. 3 is a circuit diagram of a first amplifier used in the receiver shown in FIG. 2, FIG. 4 is a circuit diagram of a second amplifier used in the receiver shown in FIG. 2, Referring to FIGS. 1 through 4, the data receiver 10 includes a first comparator 11, a first latch 13, a first amplifier 15, a second comparator 17, a second amplifier 19, a third comparator 21, an XOR gate 23, and a second latch 25.

The first comparator 11 receives and compares first and second amplitude modulated differential input signals Vin+ and Vin− and outputs a result of the comparison as a first bit Vcom1+. For instance, when the first input signal Vin+ is greater than the second input signal Vin−, the first comparator 11 outputs the first bit Vcom1+ at a first logic level (for example, a high level of "1"). When the first input signal Vin+ is less than the second input signal Vin−, the first comparator 11 outputs the first bit Vcom1+ at a second logic level (for example, a low level of "0").

The first bit Vcom1+ output from the first comparator 11 is a first bit for example, a most significant bit (MSB), of two bits output from the data receiver 10. The first latch 13 latches the first bit Vcom1+ based on a clock signal CLK fed thereto and outputs a latched signal Vout1 as the first bit of the two bits output from the data receiver 10.

As shown in FIG. 3, the first amplifier 15 includes a pair of first transistors P1 and P3 and a pair of second transistors P5 and P7. Output terminals of the first transistors P1 and P3 are respectively connected with output terminals of the second transistors P5 and P7.

The pair of first transistors P1 and P3 amplify a difference between the first input signal Vin+ and the second input signal Vin− based on a first current I1 and the pair of second transistors P5 and P7 amplify a difference between a first reference signal VrefH and a second reference signal VrefL based on the first current I1. In other words, the first amplifier 15 outputs differential output signals Vp1+ and Vp1− that have a difference corresponding to the sum of the output of the pair of the first transistors P1 and P3 and the output of the pair of the second transistors P5 and P7.

The second comparator 17 receives and compares the differential output signals Vp1+ and Vp1− output from die first amplifier 15 and outputs a first comparison signal Vcom2+. For instance, when the first differential output signal Vp1+ is greater than the second differential output signal Vp1−, the second comparator 17 outputs the first comparison signal Vcom2+ at a first, logic level, for example, a high level of "1". When the first differential output signal Vp1+ is less than the second differential output signal Vp1−, the second comparator 17 outputs the first comparison signal Vcom2+ at a second logic level, for example, a low level of "0". In other words, the second comparator 17 can compare a difference between the differential input signals Vin+ and Vin− (that is, Vin+-Vin−) with a difference between the reference signals VrefL and VrefH (that is, VrefH-VrefL) by comparing the first and second differential output signals Vp1+ and Vp1−.

As shown, in FIG. 4, the second amplifier 19 includes a pair of third transistors P9 and P11 and a pair of fourth transistors P13 and P15. Output terminals of the third transistors P9 and P11 are respectively connected with output; terminals of the fourth transistors P13 and P15. The second amplifier 19 has almost the same circuit structure and operations as the first amplifier 15, with the exception that reference signals respectively input to the fourth transistors P13 and P15 respectively have opposite phases to the reference signals respectively input to the second transistors P5 and P7. Thus, detailed descriptions thereof will be omitted.

The third comparator 21 has almost the same circuit structure and operations as the second comparator 17. Thus, detailed descriptions thereof will be omitted. In other words, the third comparator 21 can compare the difference between the differential input signals Vin+ and Vin− (that is, Vin+-Vin−) with the difference between the reference signals VrefL and VrefH ( that is, VrefH-VrefL) by comparing third and fourth differential output signals Vp2+ and Vp2−.

The XOR gate 23 performs an XOR operation on the first comparison signal Vcom2+ received from the second comparator 17 and a second comparison signal Vcom3+ received from the third comparator 21. In other words, the XOR gate 23 outputs an output signal V1 at a first logic level (for example, a high level of "1") when "second reference signal VrefL—first reference signal VrefH"<"first differential input signal Vin+—second differential input signal Vin−"<"first reference signal VrefH—second reference signal VrefL" and outputs the output signal V1 at a second logic level (for example, a low level of "0") when "second reference signal VrefL—first reference signal VrefH">"first differential input signal Vin+—second differential input signal Vin−" or "first differential input signal Vin+—second differential input signal Vin−">"first reference signal VrefH—second reference signal VrefL".

The second latch 25 latches the output signal V1 from the XOR gate 23 based on the clock signal CLK fed thereto and outputs a latched, signal Vout2 as a second bit (for example, a least significant bit (LSB)) of the two bits output from the data receiver 10.

The conventional data receiver 10, however, requires a plurality of amplifiers 15 and 19 and a plurality of comparators 17 and 21 in order to output the first bit Vout1 and also requires a separate reference signal generator (not shown) in order to generate the reference signals VrefL and VrefH input to the amplifiers 15 and 19. As a result, the many circuits implemented in the data receiver 10 may cause a chip size to increase, thereby increasing power consumption.

SUMMARY OF THE INVENTION

Exemplary embodiments of the present invention provide a data receiver and a data receiving method, by which the number of amplifiers and comparators is reduced, thereby decreasing a chip size, so that low power operation is possible.

Exemplary embodiments of the present invention provide a data receiver and a data receiving method, by which a separate reference voltage generator is not needed, thereby decreasing a chip size, so that low power operation is possible.

According to exemplary embodiments of the present invention., there is provided a receiver including a first comparator configured, to receive and compare amplitude modulated differential input signals and to generate a first indication signal and a second indication signal, which, respectively have different voltage levels, as a result of the comparison; an amplifier configured to receive and amplify the amplitude modulated differential input signals, to output, differential output signals corresponding to a voltage difference between the received signals to a pair of output terminals, and to supply a current to one of the output terminals in response to the first and second indication signals; a second comparator configured to compare voltages of the respective output terminals of the amplifier and to generate a third indication signal as a result of the comparison; and a logic circuit configured to receive the first indication signal output from the first comparator and the third indication signal output from the second comparator., to perform a logic operation on the first and third indication signals, and to output a logic operation result.

The amplifier may include a differential amplifier configured to have a first tail current, to receive and amplify the amplitude modulated differential input signals, and to output the differential output signals to the pair of output terminals; and a switching circuit configured to have a second tail current and to supply the second tail current to one of the output terminals as the current in response to the first and second indication signals.

The receiver may further include a first latch configured to latch the first indication signal in response to a clock signal. The receiver may further include a second latch configured to latch the third indication signal in response to the clock signal.

The first indication signal may have a voltage level of one of a power supply voltage and a ground voltage and the second indication signal may have a voltage level of the other of the power supply voltage and the ground voltage. The third indication signal may have a voltage level of the power supply voltage or the ground voltage. The amplitude modulated differential input signals may be signals that are subjected, to amplitude modulation according to low voltage differential signaling.

The logic circuit may be an XOR circuit, or an XNOR circuit. The receiver may be implemented in a source driver of a display apparatus.

According to exemplary embodiments of the present invention, there is provided a data receiving method including receiving and comparing amplitude modulated differential input signals and generating a first indication signal and a second indication signal which respectively have different voltage levels, as a result of the comparison, by using a first comparator; receiving and amplifying the amplitude modulated differential input signals, outputting differential output signals corresponding to a voltage difference between the received signals to a pair of output terminals of an amplifier, and supplying a current to one of the output terminals in response to the first and second indication signals, by using the amplifier; comparing voltages of the respective output terminals of the amplifier and generating a third indication signal as a result of the comparison, by using a second comparator; and receiving the first indication signal output from the first comparator and the third indication signal output from the second comparator, performing a logic operation on the first and third indication signals, and outputting a logic operation result, by using a logic circuit.

The supplying of current to one of the output terminals may include receiving and amplifying the amplitude modulated differential input signals and outputting the differential output signals to the pair of output terminals, by using a differential amplifier having a first tail current: and supplying a second tail current, to one of the output terminals as the current in response to the first and second, indication signals, by using a switching circuit having the second tail current.

The data receiving method may further include latching the first indication signal and the third indication signal in response to a clock signal. The first indication signal and the third indication signal may have a voltage level of one of a power supply voltage and a ground voltage and the second indication signal may have a voltage level of the other of the power supply voltage and the ground voltage. The amplitude modulated differential input signals may be signals that are subjected to amplitude modulation according to low voltage differential signaling. The logic circuit may be an XOR circuit or an XNOR circuit.

BRIEF DESCRIPTION OF THE DRAWINGS

Exemplary embodiments of the present invention will be understood in detail from the following descriptions taken in conjunction with the attached drawings in which;

FIG. 6 is a circuit diagram of an amplifier used in the receiver illustrated in

FIG. 5;

DETAILED DESCRIPTION OF EXEMPLARY EMBODIMENTS

The present invention now will be described more fully hereinafter with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. Like numbers refer to like elements throughout.

Figure 5:
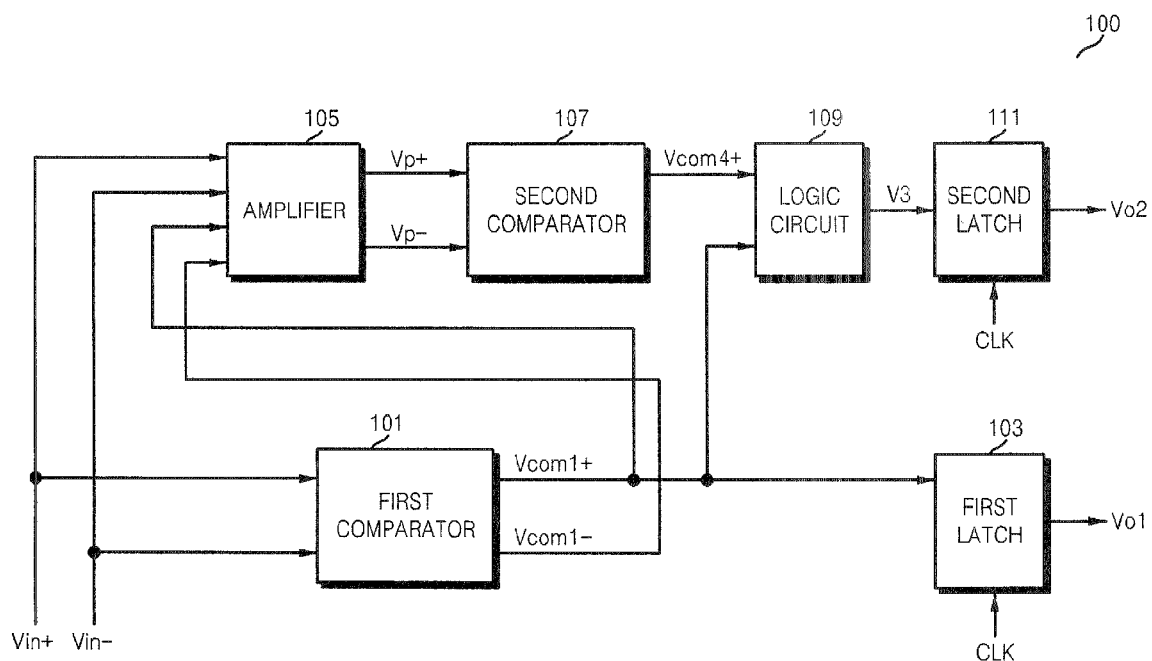
FIG. 5 is a functional block diagram of a data receiver according to an exemplary embodiment of the present invention.
Figure 6:
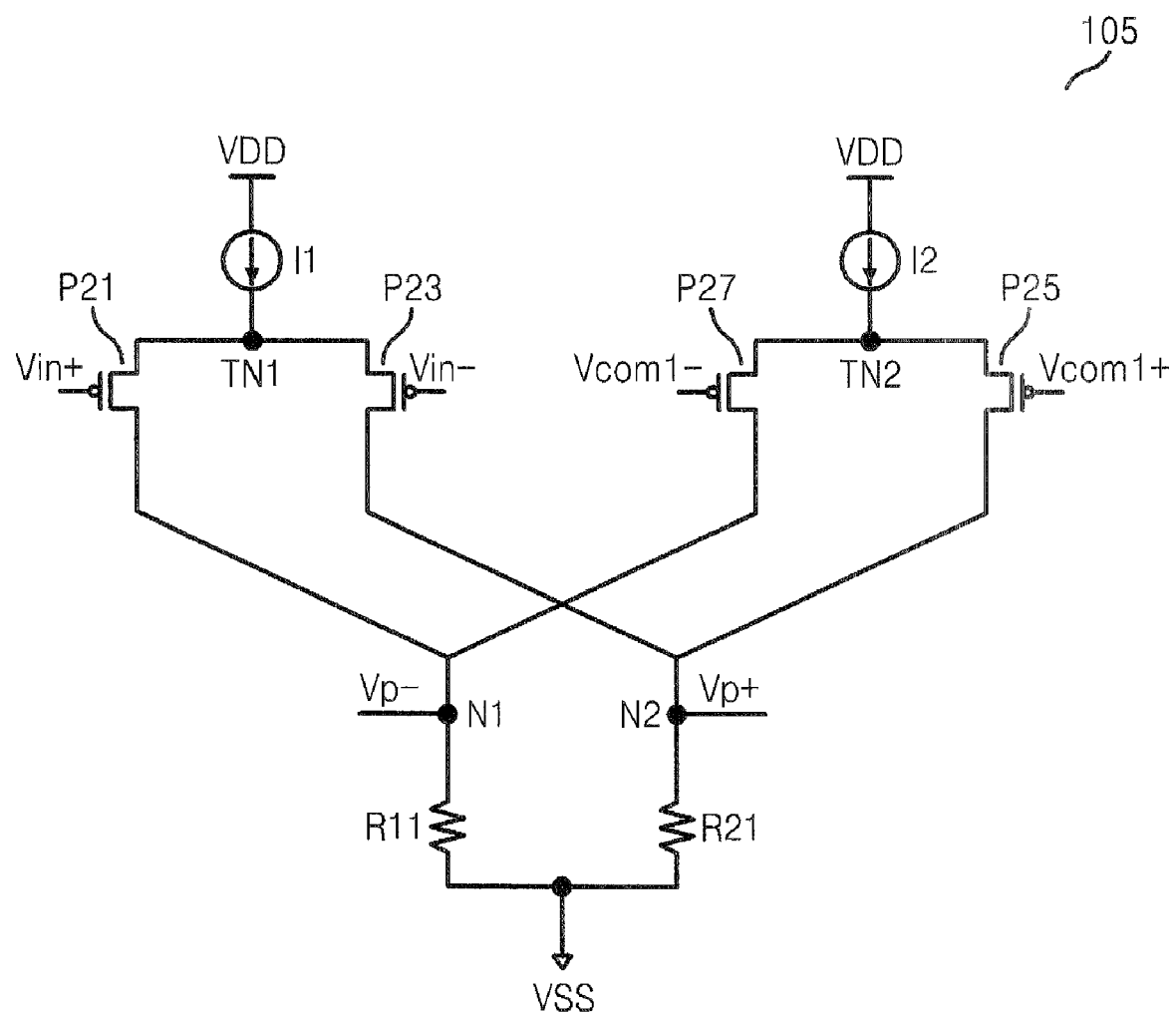

FIG. 5 is a functional block diagram of a data receiver 100 according to an exemplary embodiment of the present invention. FIG. 6 is a circuit diagram of an amplifier used in the receiver illustrated in FIG. 5. Referring to FIGS. 5 and 6, the data receiver 100, which may be implemented, in a source driver of a display apparatus, includes a first comparator 101, a first latch 103, an amplifier 105, a second comparator 107, a logic circuit 109, and a second latch 103.

The first comparator 101. receives and compares amplitude modulated first and second differential input signals Vin+ and Vin− and generates a first indication signal Vcom1+ and a second indication signal Vcom1−, which respectively have different voltage levels, as a result of the comparison. The first and second differential input signals Vin+ and Vin− may be signals that have been subjected to amplitude modulation according to low voltage differential signaling (LVDS) and the first, and second indication signals Vcom1+ and Vcom1− may be differential signals or complementary signals, but the present invention is not restricted thereto.

For instance, the first comparator 101 may output the first indication signal Vcom1+ at a first logic level (for example, a high level of "1") and the second indication signal Vcom1− at a second logic level (for example, a low level of "0") when the first differential input signal Vin+ is greater than the second differential input signal Vin−. Also, the first comparator 101 may output the first indication signal Vcom1+ at the second logic level and the second indication signal Vcom1− at the first logic level, when the first differential input signal Vin + is less than the second differential input signal Vin−. The voltage level of the first indication signal Vcom1+ may be the level of a first power supply voltage VDD and the voltage level of the second indication signal Vcom1− may be the level of a second power supply voltage VSS (for example, a ground voltage), or vice versa.

The first latch 103 latches the first indication signal Vcom1+ in synchronization with a clock signal CLK fed thereto and outputs a latched signal Vo1. The latched signal Vo1 is output as a first bit (for example, a most significant bit (MSB)) of the two bits output from the data receiver 100.

As shown in FIG. 6, the amplifier 105 receives and amplifies the first and second differential input signals Vin+ and Vin−, outputs differential output signals corresponding to a voltage difference between the first and second differential input signals Vin+ and Vin− through a pair of first and second output terminals N1 and N2, and supplies a current, (for example, I2) to one of the first and second output terminals N1 and N2 in response to the first indication signal Vcom1+ and the second indication signal Vcom1−.

The amplifier 105 shown in FIG. 6 includes a differential amplifier and a switching circuit. The differential amplifier includes a first transistor pair including a first transistor P21 and a second transistor P23. The differential amplifier has a first tail current I1, receives and amplifies the first and second differential input signals Vin+ and Vin−, and outputs the differential output signals to the pair of first and second output terminals N1 and N2, The first transistor P21 in the first transistor pair is gated in response to the first differential input signal Vin+ and forms a current path between a first tail node TN1 and the first output terminal N1. The second transistor P23 is gated in response to the second differential input signal Vin− and forms a current path between the first tail node TN1 and the second output terminal N2. The first and second transistors P21 and P23 in the first transistor pair may be implemented by PMOS transistors, but the present invention is not restricted to this exemplary embodiment. The switching circuit includes a second transistor pair including a third transistor P25 and a fourth transistor P27. The switching circuit has a second tail current I2 and supplies the second tail current I2 to one of the first and second output terminals N1 and N2 in response to the first indication signal Vcom1+ and the second indication signal Vcom1−.

The second tail current I2 may be set to satisfy the following conditions: first resistance R11×second tail current I2=second resistance R12×second tail current I2=VrefH−VrefL. In this exemplary embodiment, the first reference signal (for example, 0.9 V) and the second reference signal (for example, 0.5 V), illustrated in FIG. 1, may be VrefH and VrefL, respectively. In other words, a voltage of the first or second output terminal N1 or N2 may be shifted by a level, which corresponds to a voltage difference between the first reference signal VrefH and the second reference signal VrefL, due to the second tail current I2 flowing in one of the first and second output terminals N1 and N2.

The third transistor P25 in the second transistor pair is gated in response to the first indication signal Vcom1+ and forms a current path between a second tail node TN2 and the second output terminal N2, The fourth transistor P27 is gated in response to the second indication signal Vcom1− and forms a current path between the second tail node TN2 and the first output terminal N1. The first resistance R11 may be connected between the first output terminal N1 and a ground voltage VSS and the second resistance R21 may be connected between the second output terminal N2 and the ground voltage VSS.

Figure 2:
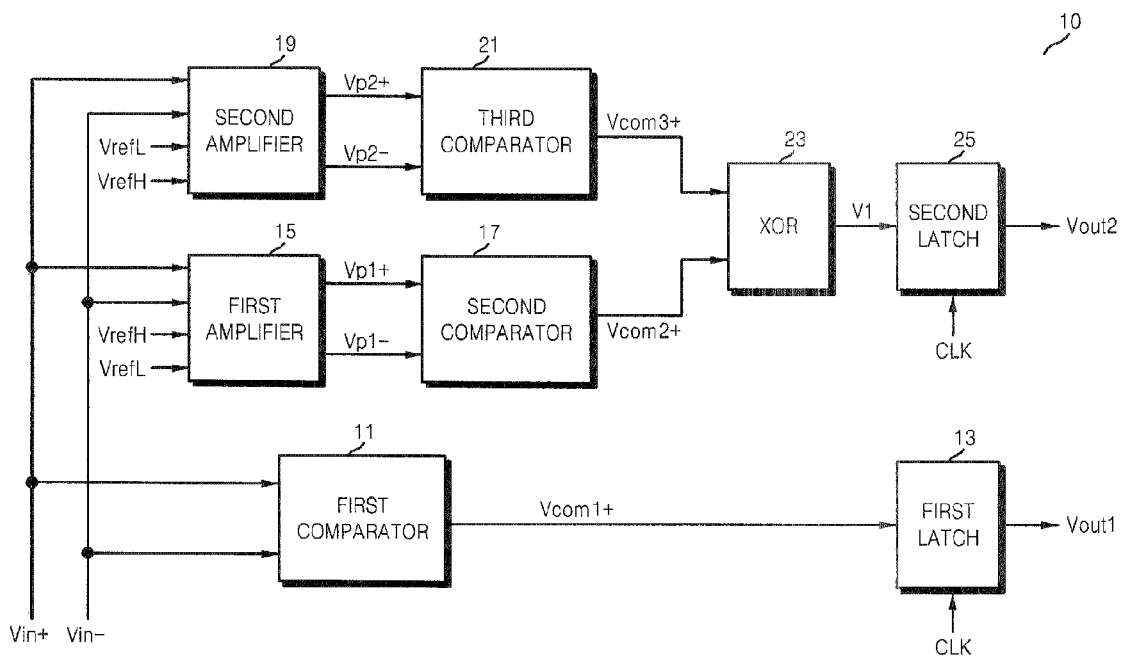
FIG. 2 is a functional, block diagram of a conventional data receiver.
Figure 3:
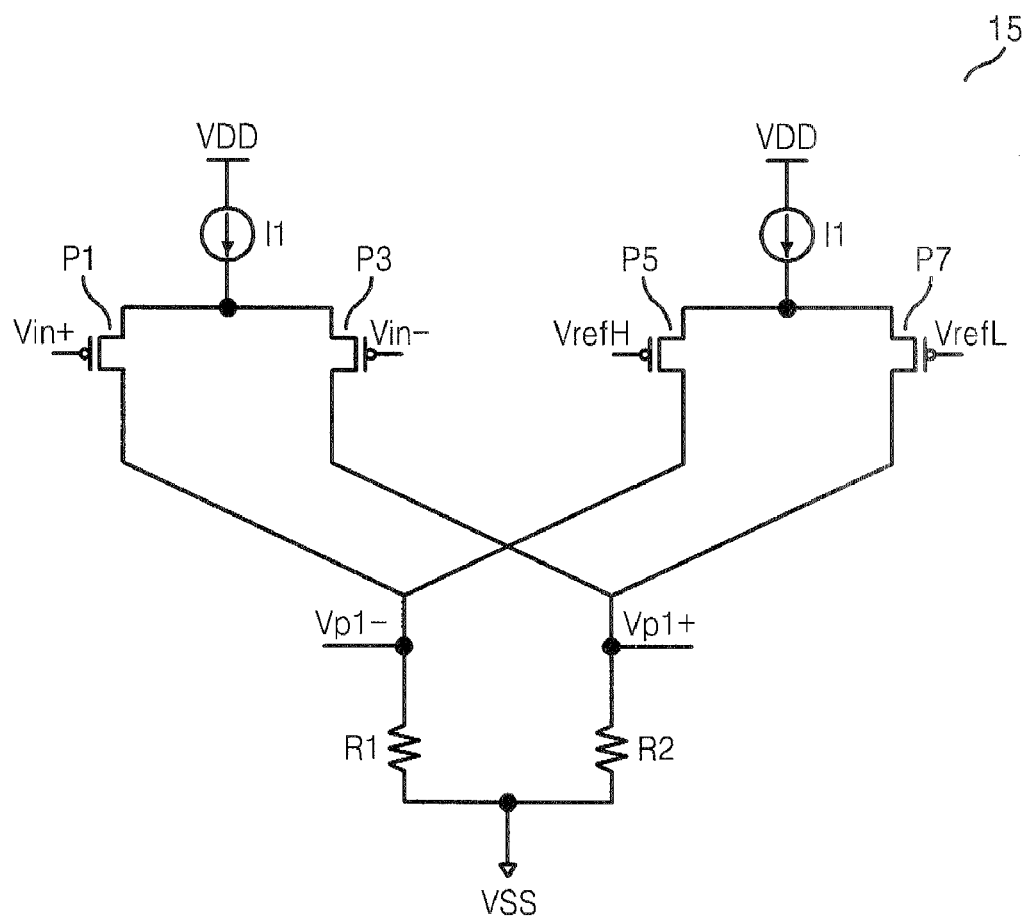
FIG. 3 is a circuit diagram of a first amplifier used in the receiver illustrated in FIG, 2.
Figure 4:
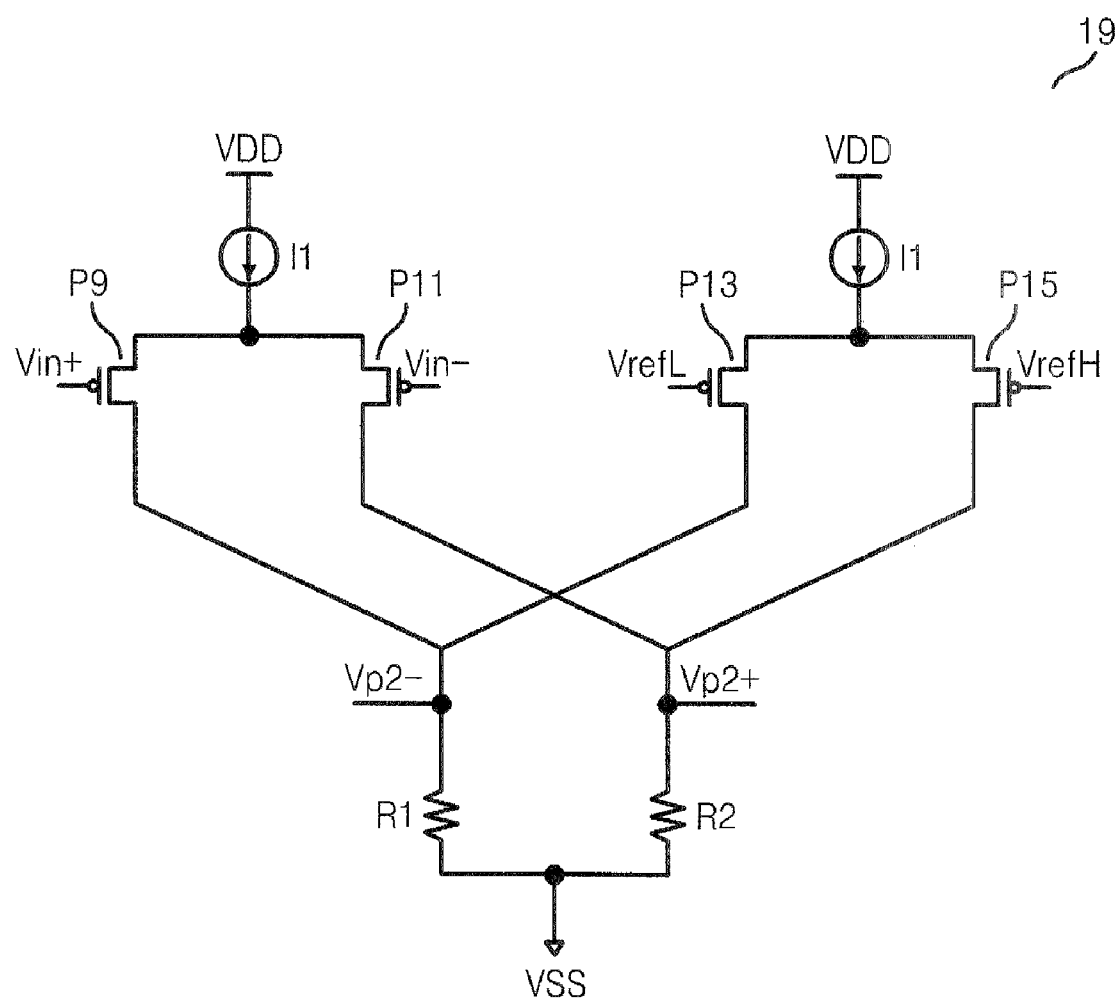
FIG. 4 is a circuit diagram of a second amplifier used in the receiver illustrated in FIG. 2.

According to an exemplary embodiment of the present invention, the amplifier 105 does not need to receive the reference voltages VrefH and VrefL generated by a separate reference generator (not shown) unlike the conventional first and second amplifiers 15 and 19 shown in FIG. 2, so that a chip size of the data receiver 100 can be reduced and the data receiver 100 can operate with lower power.

The second comparator 307 receives and compares first and second output voltages Vp+ and Vp− of the first and second output terminals N1 and N2 of the amplifier 105 and generates a third indication signal Vcom4+ as a result, of the comparison. The voltage level of the third indication signal Vcom4+ may be the level of a first power supply voltage VDD or a second power supply voltage VSS. For instance, the second comparator 107 may output the third indication signal Vcom4+ at a first logic level (for example, a high level of "1") when the first output voltage Vp+ is greater than the second output voltage Vp− and may output the third indication signal Vcom4+ at a second logic level (for example, a low level of "0") when the first output voltage Vp+ is less than the second output voltage Vp−.

The logic circuit 109 receives the first indication signal Vcom1+ output from the first comparator 101 and the third indication signal Vcom4+ output from the second comparator 107, performs a logic operation on the first and third indication signals VcomH and Vcom4+, and outputs a logic output signal V3 as a result of the logic operation. The logic circuit 109 may be implemented by an XOR circuit or an XNOR circuit. The present invention is not restricted thereto, however, and the logic circuit 109 may be implemented by an AND circuit, an OR circuit, a NAND circuit, or a NOR circuit.

The second latch 111 latches the logic output signal V3 in synchronization with the clock signal CLK fed thereto and outputs a latched signal Vo2. The latched signal Vo2 is output as a second bit (for example, a least significant bit (LSB)) of the two bits output from the data receiver 100.

Figure 7A:
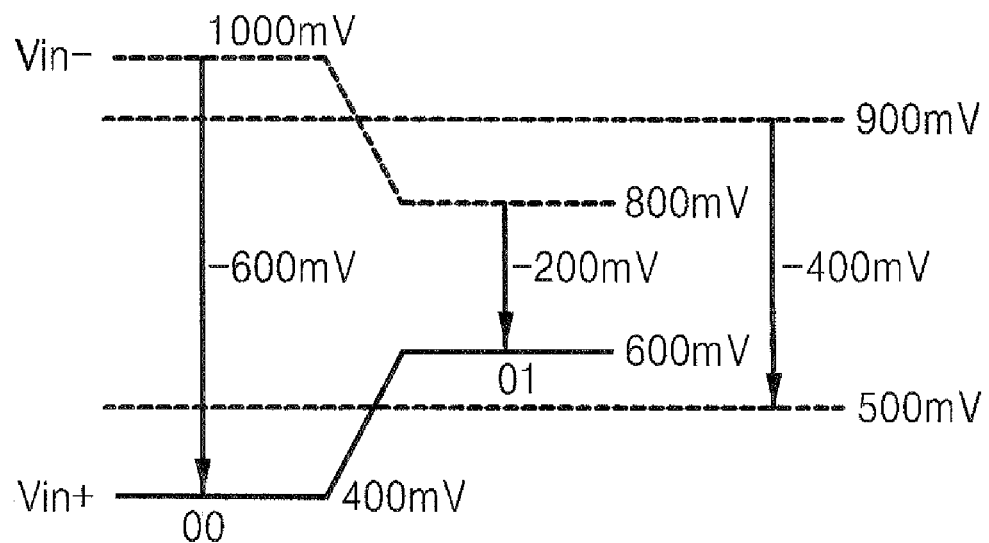
FIGS. 7a and 7b are waveform diagrams for explaining a data receiving method according to an exemplary embodiment of the present invention.
Figure 7B:
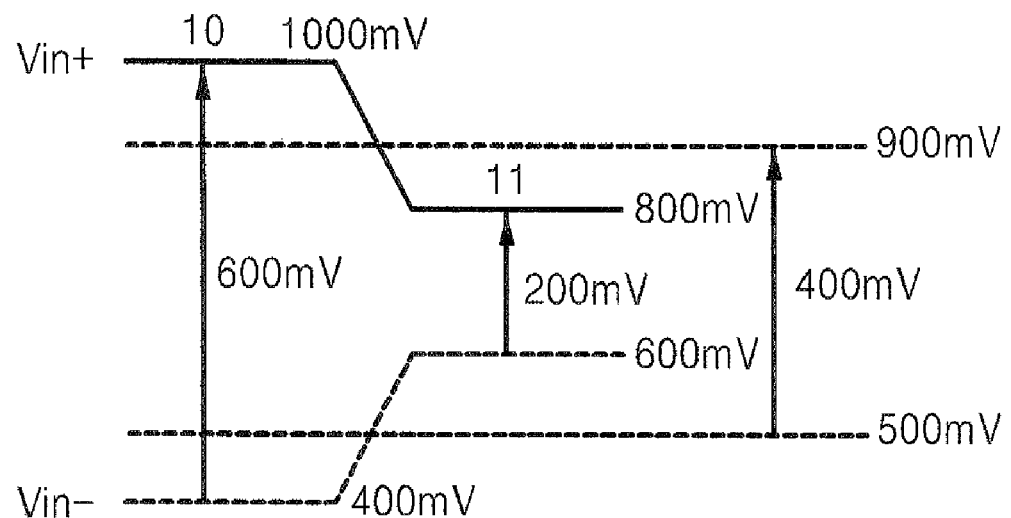
Figure 8:
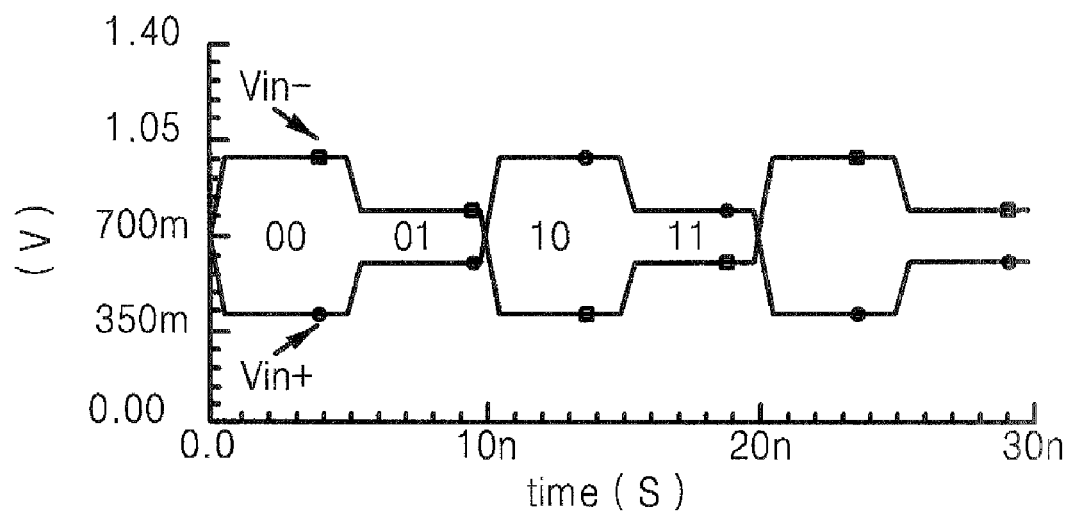
FIG. 8 is a waveform diagram illustrating differential input signals of a data receiver, according to an exemplary embodiment of the present invention.
Figure 9:
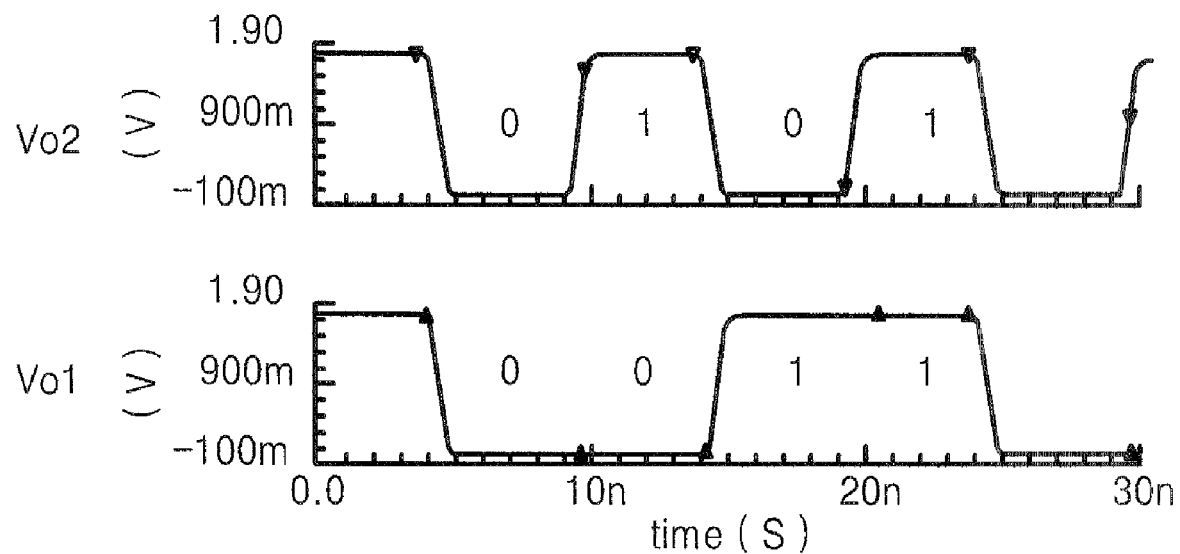
FIG. 9 is a waveform diagram illustrating output signals of a data receiver, according to an exemplary embodiment of the present invention.

FIGS. 7a and 7b are waveform diagrams for explaining a data receiving method according to an exemplary embodiment of the present invention. FIG. 8 is a waveform diagram illustrating differential input signals of a data receiver, according to an exemplary embodiment of the present invention. FIG. 9 is a waveform diagram illustrating output signals of a data receiver, according to an exemplary embodiment of the present invention.

Figure 1:
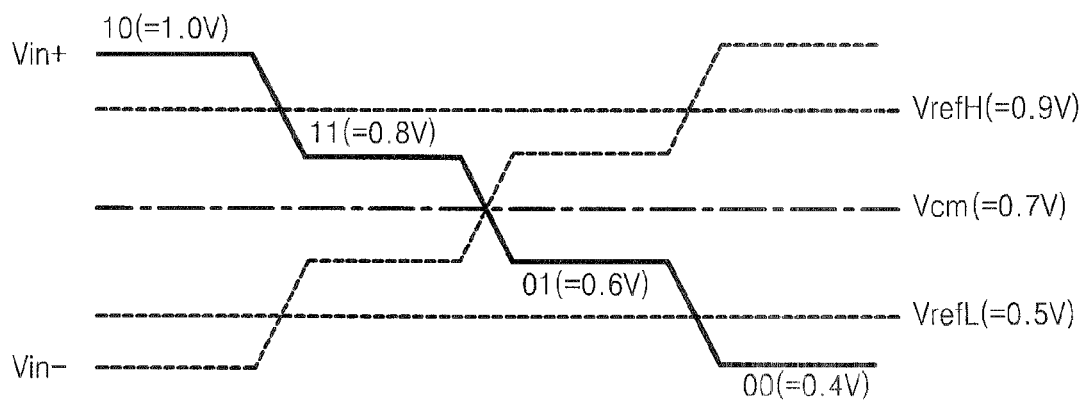
FIG. 1 is a waveform diagram for explaining amplitude modulation in conventional low voltage differential signaling (LVDS)

It is assumed that the first and second differential input signals Vin+ and Vin− have one symbol state among four symbols, 00, 01, 10, and 11, as illustrated in FIG. 1. Hereinafter, it is assumed that the following conditions are satisfied: first resistance R11×second tail current I2=second resistance R21×second tail current I2=VrefH−VrefL), it is further assumed that the first reference signal VrefH is 900 mV, and the second reference signal VrefL is 500 mV.

When the first and second differential input signals Vin+ and Vin− have a symbol state of "00", that is, when the first differential input signal Vin+ has a voltage level of 400 mV and the second differential input signal Vin− has a voltage level of 1000 mV, the first comparator 101 outputs the first indication signal Vcom1+ at the second logic level (that is, the low level of "0") and the second indication signal Vcom1− at the first logic level (that is, the high level of "1"), since the first differential input signal Vin+ is less than the second differential input signal Vin−.

The first latch 103 latches the first indication signal Vcom1+ at the second logic level (that is, "0") in synchronization with the clock signal CLK and outputs the latched signal Vo1, which is output as the first bit (that is, the MSB) between two bits output from the data receiver 100.

The third transistor P25 in the amplifier 105 is turned on in response to the first indication signal Vcom1+ at the second logic level (that is, "0"), so that the second tail current I2 flows via only the second resistance R21. As a result, the voltage level of the second output, terminal N2 is shifted, by "second tail current I2×second resistance R21".

Since the first and second transistors P21 and P23 in the first transistor pair are implemented by PMOS transistors, the first output voltage Vp+ has a value of 400 mV+400 mV=800 mV and the second output voltage Vp− has a value of 1000 mV, The second comparator 107 outputs the third indication signal Vcom4+ at the second logic level (that is, "0"), since the first output voltage Vp+ is less than the second output voltage Vp−.

The logic circuit 109 receives the first indication signal Vcom1+ at the second logic level ("0") output from the first comparator 101 and the third indication signal Vcom4+ at the second, logic level ("0") output from the second comparator 107, performs an XOR operation on the first and second indication signals Vcom1+ and Vcom4+, and outputs the logic output signal V3 at the second logic level ("0").

The second latch 111 latches the logic output signal V3 at the second, logic level ("0") in synchronization with the clock signal CLK fed thereto and outputs the logic output signal V3 as the second bit between the two bits output from the data receiver 100.

In other words, when the symbols of the first and second differential input signals Vin+ and Vin− of the data receiver 100 are "00" as illustrated in FIG. 8, the data receiver 100 outputs "0" as the first bit Vo1 and "0" as the second bit Vo2 as illustrated in FIG. 9. Consequently, when a voltage difference (that is, −600 mV) between the first differential input signal Vin+ and the second differential input signal Vin− is less than a difference (that is, −400 mV) between the first reference voltage VrefH and the second reference voltage VrefL, the second bit is "0".

When the first and second differential input signals Vin+ and Vin− have a symbol state of "01", that is, when the first differential input signal Vin− has a voltage level of 600 mV and the second differential input signal Vin− has a voltage level of 800 mV, the first comparator 101 outputs the first indication signal VcomH at the second logic level ("0") and the second indication signal Vcom1− at the first logic level ("0") since the first differential input signal Vin+ is less than the second differential input signal Vin−.

The first latch 103 latches the first indication signal Vcom1+ at the second logic level ("0") in synchronization with the clock signal CLK fed thereto and outputs the latched signal Vo1, which is output as the first bit (that is, the MSB=0) of the two bits output from the data receiver 100.

The third transistor P25 in the amplifier 105 is turned on in response to the first indication signal Vcom1+ at the second logic level ("0"), so that the second tail current I2 flows via only the second resistance R21. As a result, the voltage level of the second output terminal N2 is shifted by "second tail current I2×second resistance R21".

Since the first and second transistors P21 and P23 in the first transistor pair are implemented by PMOS transistors, the first output voltage Vp+ has a value of 600 mV+400 mV=3000 mV and the second output voltage Vp− has a value of 800 mV. The second comparator 107 outputs the third indication signal Vcom4+ at the first logic level ("1") since the first output voltage Vp+ is greater than the second output voltage Vp−.

The logic circuit 109 receives the first indication signal Vcom1+ at the second logic level ("0") output from the first comparator 101 and the third indication signal Vcom4+ at the first logic level ("1") output from the second comparator 107, performs an XOR operation on the first and second indication signals Vcom1+ and Vcom4+, and outputs the logic output signal V3 at the first logic level ("1").

The second latch 111 latches the logic output, signal V3 at the first logic level ("1") in synchronization with the clock signal CLK and outputs the logic output signal V3 as the second bit (that is, the LSB=1) of the two bits output from the data receiver 100.

In other words, when the symbols of the first and second differential input signals Vin+ and Vin− of the data receiver 100 are "01" as illustrated in FIG. 8, the data receiver 100 outputs "0" as the first bit Vo1 and "1" as the second bit Vo2 as illustrated in FIG. 9. Consequently, when a voltage difference (that is, −200 mV) between the first differential input signal Vin+ and the second differential input signal Vin− is greater than a difference (that is, −400 mV) between the first reference voltage VrefH and the second reference voltage VrefL, the second bit is "1"

The operations of the data receiver 100 receiving data when the first and second differential input signals Vin+ and Vin− have a symbol state of "10", that is, when the first differential input signal Vin+ has a voltage level of 1000 mV and the second differential input signal Vin− has a voltage level of 400 mV, and when the first and second differential input signals Vin+ and Vin− have a symbol state of "11", that is, when the first differential input signal Vin+ has a voltage level of 800 mV and the second differential input signal Vin− has a voltage level of 600 mV, will be easily understood by those with ordinary skill in the art based on the above-described description. Thus, detailed descriptions thereof will be omitted.

The data receiver 100 is a circuit for detecting two bits based on the amplitude modulated differential input signals Vin+ and Vin−. According to exemplary embodiments of the present invention, however, at least one circuit, which is the same as or similar to a circuit including the amplifier 105, the second comparator 107, the logic circuit 109, and the second latch 111, may be further provided, so that a circuit for detecting N bits (where N is a natural number) based on the amplitude modulated differential input signals Vin+ and Vin− may be implemented.

Figure 10:
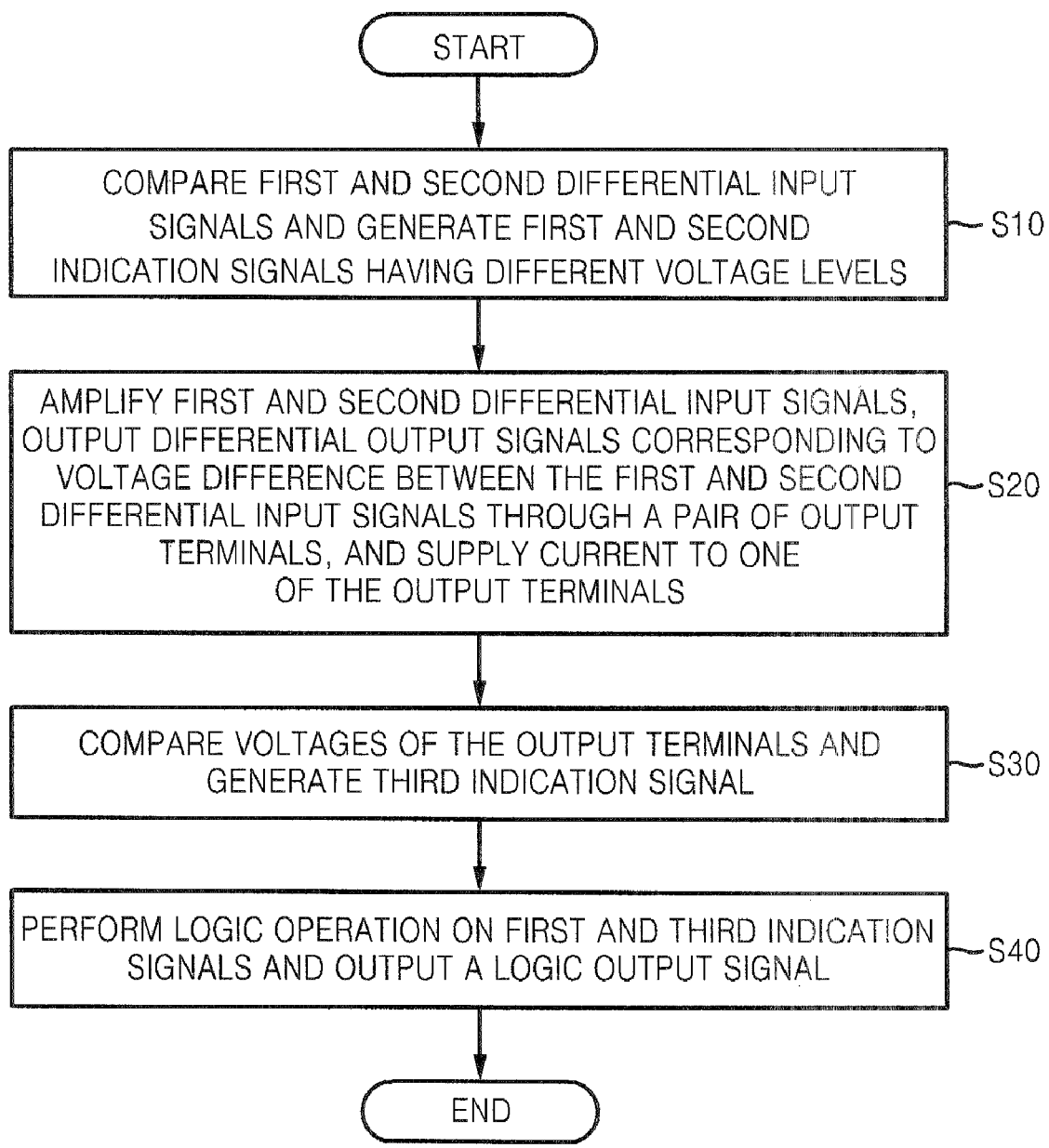
FIG. 10 is a flowchart of a data receiving method according to an exemplary embodiment of the present invention.

FIG. 10 is a flowchart of a data receiving method according to an exemplary embodiment of the present invention. Referring to FIGS. 5, 6 and 10, in operation S10 the first comparator 101 receives and compares the amplitude modulated first and second differential input signals Vin+ and Vin− and generates the first indication, signal Vcom1+ and the second indication signal Vcom1−, which respectively have different voltage levels, as a result of the comparison.

In operation S20, the amplifier 105 receives and amplifies the first and second differential input signals Vin+ and Vin−, outputs differential output signals corresponding to a voltage difference between the first and second differential input signals Vin+ and Vin− through the pair of the first and second output terminals N1 and N2, and supplies a current (for example, I2) to one of the first and second output terminals N1 and N2 in response to the first indication signal Vcom1+ and the second indication signal Vcom1−.

In operation S30, the second comparator 107 compares first and second output voltages Vp+ and Vp− of the first and second output terminals N1 and N2 of the amplifier 105 and generates the third indication signal Vcom4+ as a result of the comparison. In operation S40, the logic circuit 109 receives the first indication signal Vcom1+ output from the first comparator 101 and the third indication signal Vcom4+ output from the second comparator 107, performs a logic operation on the first and third indication signals Vcom1+ and Vcom4+, and outputs the logic output signal V3 as a result of the logic operation.

Figure 11:
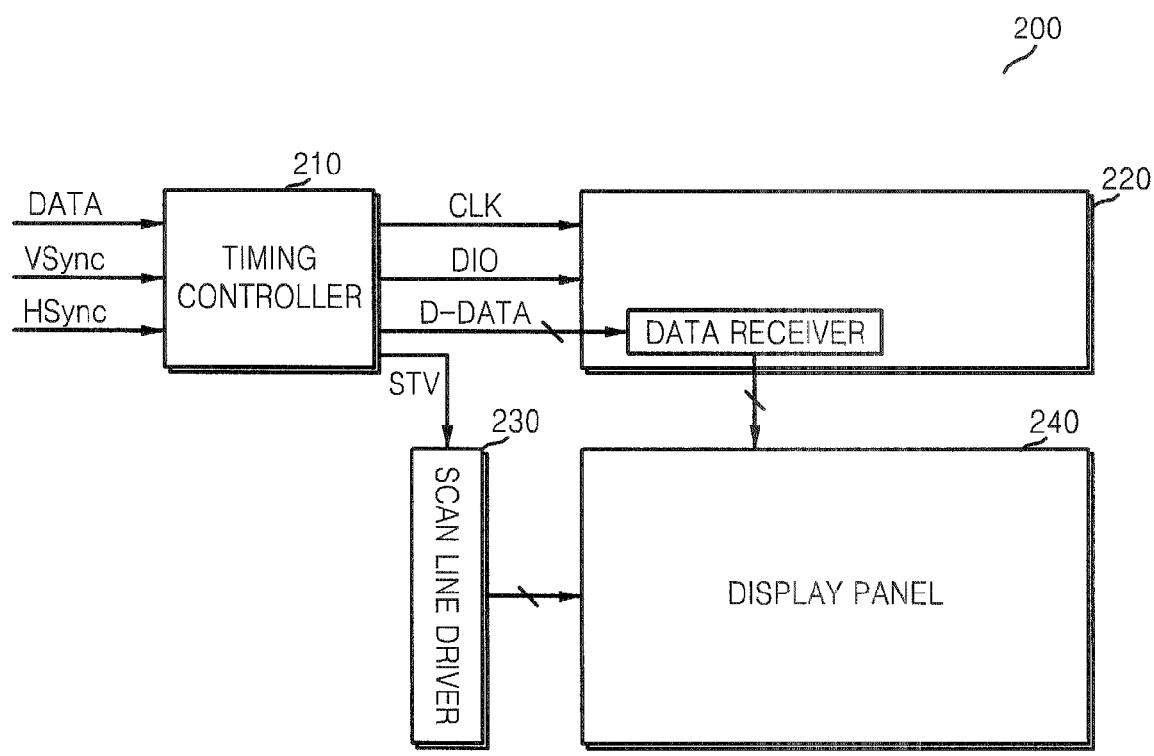
FIG. 11 is a functional block diagram, of a display apparatus including a data receiver according to an exemplary embodiment of the present invention.

FIG. 11 is a functional block diagram of a display apparatus 200 including a data receiver according to an exemplary embodiment of the present invention. Referring to FIGS. 5, 6 and 11, the display apparatus 200 includes a display panel 240, a timing controller 210, a data line driver (or a source driver) 220, and a scan line driver (or a gate driver) 230.

The display panel 240 includes a plurality of data lines or source lines (not shown), a plurality of scan lines or gate lines (not shown), and a plurality of thin film transistors (not shown) connected between the data lines and the scan lines, and the display panel 240 displays images.

The timing controller 210 receives digital image data DATA and control signals, such as a vertical synchronizing signal Vsync and a horizontal synchronizing signal Hsync, outputs digital image data D_DATA, a horizontal start signal DIO and a load signal CLK to the data line driver 220, and outputs a vertical start signal or a vertical synchronizing start signal STV to the scan line driver 230.

The vertical synchronizing signal Vsync is a reference signal for referring to a single frame. The operation of displaying a single frame is performed during a single period of the vertical synchronizing signal Vsync. The horizontal synchronizing signal Hsync is a reference signal referring to a single line, that is, a scan line. The operation of displaying a single line is performed during a single period of the horizontal synchronizing signal Hsync.

The data line driver 220 drives the plurality of data lines of the display panel 240 based on the digital image data D_DATA and control signals, that is, the horizontal, start signal DIO and the load signal CLK, which are output from the timing controller 210, The data line driver 220 includes the data receiver 100 illustrated in FIG. 5. The data receiver 100 detects output bits based on the digital image data D_DATA input as the amplitude modulated differential input signals Vin+ and Vin− and outputs a control signal for controlling the plurality of data lines of the display panel 240 based on the control signals DIO and CLK and the output bits. The detailed structure and operations of the data receiver 100 have been described above, thus detailed description thereof will be omitted.

The vertical start signal STV is for selecting a first scan line. Generally, the scan line driver 230 sequentially drives the scan lines when the vertical start signal STV transits from a low level to a high level.

As described above, according to exemplary embodiments of the present invention, the number of amplifiers and comparators is reduced and, therefore, a chip size can be decreased and low-power operation can be accomplished. In addition, since a separate reference voltage generator is not necessary, chip size reduction and low-power operation can be accomplished.

While the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. A receiver comprising:
   a first comparator configured to receive and compare amplitude modulated differential input signals and to generate a first indication signal and a second indication signal, which respectively have different voltage levels, as a result of the comparison;
   an amplifier configured to receive and amplify the amplitude modulated differential input signals, to output differential output signals corresponding to a voltage difference between the received signals to a pair of output terminals, and to supply a current to one of the output terminals in response to the first and second indication signals;
   a second comparator configured to compare voltages of the respective output terminals of the amplifier and to generate a third indication signal as a result of the comparison; and
   a logic circuit configured to receive the first indication signal output from the first comparator and the third indication signal output from the second comparator, to perform, a logic operation on the first and third indication signals, and to output a logic operation result.

2. The receiver of claim 1, wherein the amplifier comprises:
   a differential amplifier configured, to have a first tail current, to receive and amplify the amplitude modulated differential input signals, and to output the differential output signals to the pair of output terminals; and
   a switching circuit configured to have a second tail current and to supply the second tail current to one of the pair of output terminals as the current in response to the first, and second indication signals.

3. The receiver of claim 1, further comprising a first latch configured to latch the first indication signal in response to a clock signal fed thereto.

4. The receiver of claim 3, further comprising a second latch configured to latch the third indication signal in response to the clock signal fed thereto.

5. The receiver of claim 1, wherein the first indication signal has a voltage level of one of a power supply voltage and a ground voltage and the second indication signal has a voltage level of the other of the power supply voltage and the ground voltage.

6. The receiver of claim 1, wherein the third indication signal has a voltage level of a power supply voltage or a ground voltage.

7. The receiver of claim 1, wherein the amplitude modulated differential input signals are signals that were subjected to amplitude modulation according to low voltage differential signaling.

8. The receiver of claim 1, wherein the logic circuit is one of an XOR circuit and an XNOR circuit.

9. The receiver of claim 1, wherein the receiver is implemented in a source driver of a display apparatus.

10. A data receiving method comprising:
    receiving and comparing amplitude modulated differential input signals and generating a first indication signal and. a second, indication signal which respectively have different voltage levels, as a result of the comparison performed by a first comparator;
    receiving and amplifying the amplitude modulated differential input signals, outputting differential output signals corresponding to a voltage difference between the received signals to a pair of output terminals of an amplifier, and supplying a current to one of the output terminals in response to the first and second indication signals, by using the amplifier;
    comparing voltages of the respective output terminals of the amplifier and generating a third indication signal as a result of the comparison performed by a second comparator: and
    receiving the first indication signal output from the first comparator and the third indication signal output from the second comparator, performing a logic operation on the first and third indication signals, and outputting a logic operation result, by using a logic circuit.

11. The data receiving method of claim 10, wherein the step of supplying the current to one of the output terminals comprises:
    receiving and amplifying the amplitude modulated differential input signals and outputting the differential output signals to the pair of output terminals, by using a differential amplifier having a first tail current; and
    supplying a second tail current to one of the output terminals as the current in response to the first and second indication signals, by using a switching circuit having the second tail current.

12. The data, receiving method of claim 10, further comprising latching the first indication signal and the third indication signal respectively in response to a clock signal.

13. The data receiving method of claim 10, wherein the first indication signal and the third indication signal have a voltage level of one of a power supply voltage and a ground voltage and the second indication signal has a voltage level of the other of the power supply voltage and the ground voltage.

14. The data receiving method of claim 10, wherein the amplitude modulated differential input signals are signals that; are subjected to amplitude modulation according to low voltage differential signaling.

15. The data receiving method of claim 10, wherein the logic circuit is one of an XOR circuit and an XNOR circuit.

* * * * *